United States Patent [19]

Hayakawa et al.

[11] Patent Number: 4,536,786
[45] Date of Patent: Aug. 20, 1985

[54] LEAD ELECTRODE CONNECTION IN A SEMICONDUCTOR DEVICE

[75] Inventors: Masao Hayakawa, Kyoto; Takamichi Maeda; Masao Kumura, both of Nara, all of Japan

[73] Assignee: Sharp Kabushiki Kaisha, Osaka, Japan

[21] Appl. No.: 39,820

[22] Filed: May 17, 1979

Related U.S. Application Data

[63] Continuation of Ser. No. 826,635, Aug. 22, 1977, abandoned.

[30] Foreign Application Priority Data

Aug. 23, 1976 [JP] Japan .................. 51-113137[U]

[51] Int. Cl.³ .................. H01L 23/48; H01L 29/44; H01L 29/52
[52] U.S. Cl. .................. 357/68; 357/80; 357/65; 228/180.2
[58] Field of Search .................. 357/68, 74, 80, 65; 228/180 A

[56] References Cited

U.S. PATENT DOCUMENTS

| | | | |
|---|---|---|---|
| 3,374,537 | 3/1968 | Doelp | 228/180 |
| 3,689,803 | 9/1972 | Baker et al. | 357/68 |
| 3,707,655 | 12/1972 | Rudolph et al. | 357/68 |
| 3,724,068 | 4/1973 | Galli | 357/74 |
| 3,871,014 | 3/1975 | King et al. | 357/65 |
| 3,871,015 | 3/1975 | Lin et al. | 357/65 |
| 4,010,488 | 3/1977 | Gruszka | 357/68 |
| 4,109,096 | 8/1978 | Dehaine | 357/68 |

FOREIGN PATENT DOCUMENTS

| | | | |
|---|---|---|---|
| 1231042 | 5/1971 | United Kingdom | 357/68 |
| 1363431 | 8/1974 | United Kingdom | 357/68 |

OTHER PUBLICATIONS

Electronics, Film Carrier Technique Automates the Packaging of IC Chips; by Grossman; pp. 89–95, May 1974.

IBM Technical Disclosure Bulletin; Transistor Structure; by Collins; vol. 10, No. 4, Sep. 1967, p. 496.

Primary Examiner—Andrew J. James
Attorney, Agent, or Firm—Birch, Stewart, Kolasch & Birch

[57] ABSTRACT

Raised contacts included within a semiconductor chip are bonded to respective external leads through the use of a bonding tool. The raised contacts and/or the external leads are varied in a fashion depending on their locations on a semiconductor substrate so as to compensate for lack of uniformity of the surface temperature of the bonding tool.

9 Claims, 5 Drawing Figures

LEAD ELECTRODE CONNECTION IN A SEMICONDUCTOR DEVICE

This application is a continuation of copending application Ser. No. 826,635, filed Aug. 22, 1977, now abandoned.

BACKGROUND OF THE INVENTION

The present invention relates to a semiconductor device manufactured through the use of a longitudinally extending tape-like carrier including a metallic layer secured on a flexible insulative layer, said insulative layer having centrally located longitudinally spaced apertures.

It has been proposed to provide a semiconductor device mounted on a flexible carrier for the sake of reduction of manufacturing cost and facilitating mass production. For example, U.S. Pat. No. 3,763,404, "SEMICONDUCTOR DEVICE AND MANUFACTURE THEREOF" to Alanson D. Aird shows a semiconductor device mounted on a flexible carrier.

In the prior art technique, the contact regions between lead patterns formed on a flexible film and metallic raised contacts or bumps provided on a semiconductor pellet have similar dimensions, without regard to the locations of the metallic contacts. However, the strength of bonded contacts between the lead patterns and the metallic raised contacts is not uniform because of the variation of the heat which is developed in the bonding tool as described hereinbelow.

A semiconductor pellet usually has gold-covered raised metallic contacts, e.g., bumps attached to electrically active regions of the semiconductor pellet. Tin plated copper leads formed on an insulating film are placed in abutment with the gold-covered raised metallic contacts. The tin plated copper leads are pressed against the gold surface portions of the gold-covered raised metallic contacts by the downward movement of a heatable bonding tip to affect the bonding of the gold-covered raised metallic contacts to the tin plated copper leads. Bonding is then achieved by applying a suitable electrical resistance heating current to the bonding tip. Since the heat temperature developed on the bonding tip is not uniform, the bonding strength between the gold-covered raised metallic contact and the tin plated copper lead is unavoidably varied to a degree depending on the various locations of the raised metallic contacts or bumps.

SUMMARY OF THE INVENTION

Accordingly, one object of the present invention is to provide an improved semiconductor device manufactured through the use of bonding techniques.

Another object of the present invention is to provide an improved semiconductor device, wherein external leads are firmly connected to metallic contact regions provided on the semiconductor chip surface by bonding the external leads to the metallic contact regions.

To achieve the above objectives, pursuant to an embodiment of the present invention, the metallic contact regions vary in dimension or the external leads are disposed in varying degrees on the semiconductor portions where a bonding tool reveals a small value of heat temperature, rather than in the portion where the bonding tool reveals a large value of heat temperature. Therefore, the strong and uniform connection between the metallic contact regions and the external leads are achieved with a minimum application of direct labor and attendant minimization of manufacturing cost.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Figure 1:
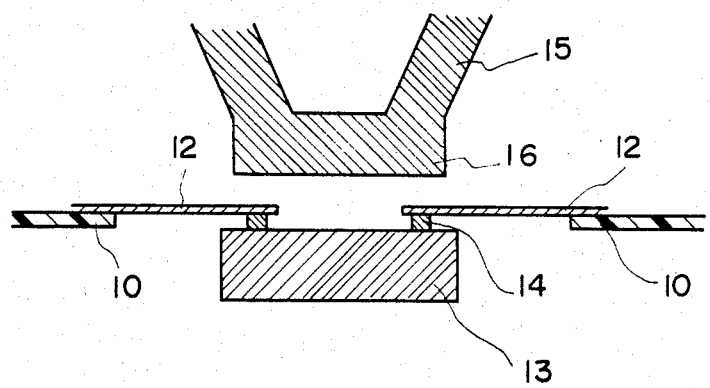
FIG. 1 is a sectional view of a conventional bonding system.

FIG. 1 shows an example of the conventional bonding system, wherein an external lead 12 mounted on an insulating layer 10 is connected to a raised metallic contact 14 attached to an electrically active region of a semiconductor pellet 13 through the use of a bonding tool 15. The raised metallic contact 14 is coated with gold and the external lead 12 is, in a preferred form, a tin plated copper lead. Bonding is achieved by applying a suitable electrical resistance heating current to a heatable tip 16 of the bonding tool 15, whereby the external lead 12 is bonded to the raised metallic contact 14.

Figure 2:
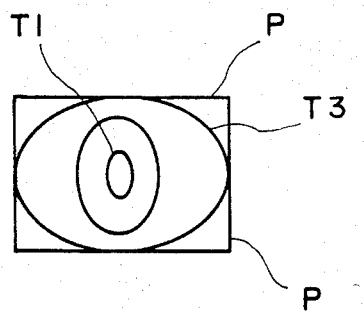
FIG. 2 is a temperature map in the bonding tip of the bonding tool employed in the bonding system of FIG. 1.

The heat temperature developed on the heatable tip 16 of the bonding tool 15 is not uniform. FIG. 2 depicts an isothermal line of the heat temperature developed on the surface of the heatable tip 16. The heat temperature $T_1$ is high in the center of the surface of the heatable tip 16 because at this location the heating current readily flows and the heat thus produced is not readily lost or discharged. The heat temperature $T_3$ is low in the periphery of the surface of the heatable tip 16, especially at its corner where there is a small flow of heating current and a large discharge of heat energy to the environment.

In the prior technique, the contact regions between the external leads 12 and the raised contacts 14 are the same in all the positions of the bonded couples. Thus the bonded couples are not strong at the corner of the heatable tip 16 of the bonding tool 15 because of the above reason. To resolve the above problems, the electrical resistance heating current employed within the bonding tool 15 can be maximized to establish a stable bond thereof even at the corners. However, overheating is produced in the remaing bonded couples, especially at the center of the semiconductor chip, whereby the $A_r\text{-}S_n$ eutectic is highly developed to an undesirable extent at the center of the semiconductor chip. The external lead 12 is thus short-circuited to the semiconductor pellet 13.

Figure 3:
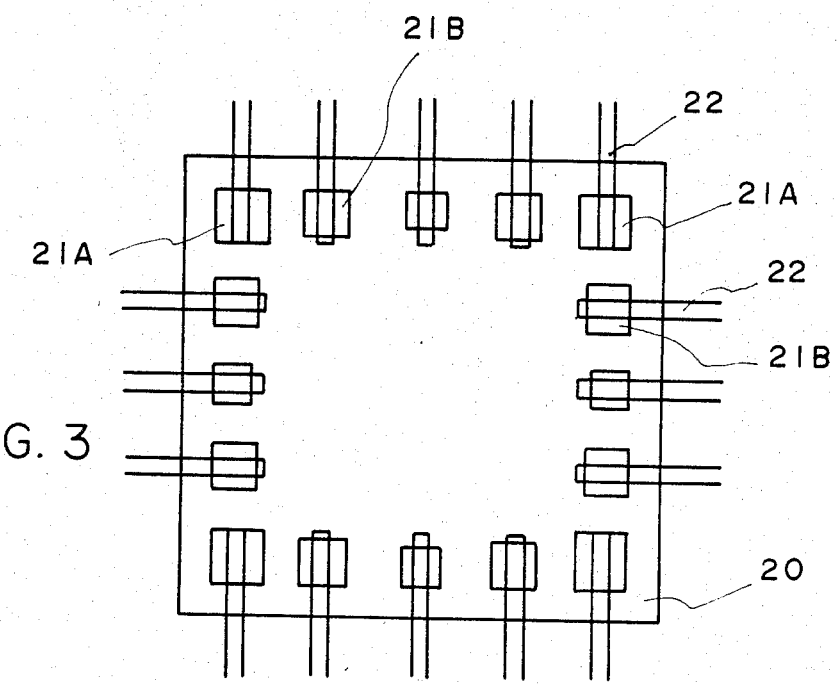
FIGS. 3 through 5 are plan views of the external leads and the metallic contact regions or bumps of the present invention.
Figure 4:
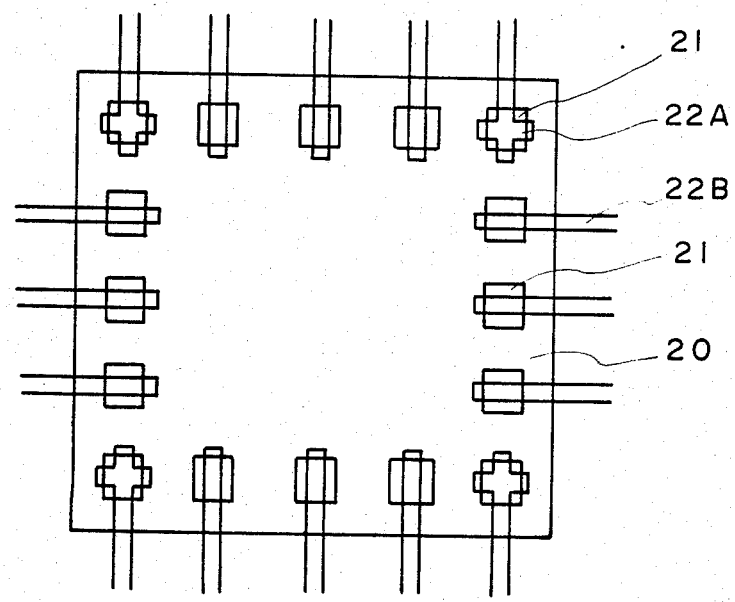
Figure 5:
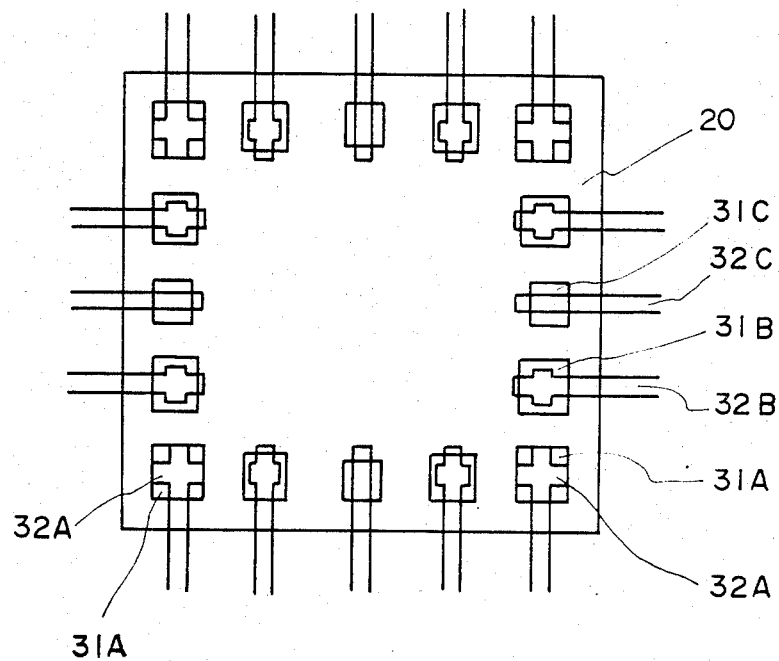

FIGS. 3 through 5 show the improved semiconductor device manufacture through the above bonding system of the present invention. Desirable semiconductor circuits are included within a semiconductor pellet 20. Raised contacts 21A and 21B are installed on the semiconductor pellet 20 engage with to external leads 22, respectively. The external leads 22 are formed through the use of a metallic thin film in a predetermined pattern on the surface of the insulating plate 10 such as a polyimide flexible film or a ceramic substrate.

The raised contacts 21A, 21B and the external leads 22 correspond to each other. The $A_u$-$S_n$ eutectic is provided for bonding the raised contacts 21A, 21B and the external leads 22, when the raised contacts 21A, 21B are gold-covered or made of gold and the external leads 22 are tin plated copper leads.

The raised contacts 21A is larger than the remaining raised contacts 21B, said raised contacts 21A corresponding to the corner of the heatable tip 16 of the bonding tool 15. All of the external leads 22 have the same sizes. Bonding is achieved by applying a predetermined electrical resistance heating current to the heatable tip 16 of the bonding tool 15 after confronting the raised contacts 21A, 21B to the external leads 22. The strong connections between the external leads 22 and the raised contacts 21A are established due to the large size of the raised contacts 21A, even though the raised contacts 21A are in contact with the peripheral portion of the bonding tip 16.

Attention is directed to FIG. 4 showing another embodiment of the present invention, wherein the external leads 22A corresponding to the corner of the heatable tip 16 are longer thereby providing a greater contact, when compared to the remaining external leads 22B, and the raised contacts 21 formed on the semiconductor pellet 20 are similar in size to the other contacts. The external leads 22A are in the shape of a Latin cross.

Further attention is directed to FIG. 5 showing still another embodiment of the present invention, wherein the external leads and the raised contacts are varied depending on the position thereof. An external lead 32A corresponding to the corner of the heatable tip 16 is larger than an external lead 32B. The external lead 32B is larger than an external lead 32C. A raised contact 31A formed on the semiconductor pellet 20 is associated with the external lead 32A. Raised contacts 31B and 31C are associated with the external leads 32B and 32C, respectively. The raised contact 31A is larger than the raised contact 31B, which is larger than the raised contact 31C.

It is apparent that the external leads 22A, 32A, and 32B and the raised contacts 21A, 31A and 31B can be shaped in any form. Also metallic plates such as lead frames, can be utilized for the external leads rather than the above-finger-like leads.

The invention being thus described, it will be obvious that the same may be varied in many ways. Such variations are not to be regarded as a departure form the spirit and scope of the invention, and all such modifications are intended to be included within the scope of the following claims.

What is claimed is:

1. A semiconductor device comprising a plurality of external leads to be bonded to a plurality of contacts by the application of a heat-bonding tool thereto, said heat-bonding tool exhibiting a nonuniform heat distribution, gradient when applied to said plurality of contacts and said plurality of external leads to be heat-bonded thereto, said plurality of contacts and external leads selectively having varying sizes and areas for varying the bonding area therebetween, thereby achieving effective bonding despite said nonuniform heat distribution of said heat-bonding tool, said variation in the bonding area between the contacts and external leads compensating for the variations in said heat distribution thereby establishing a substantially uniform bonding strength between said contacts and said external leads.

2. The semicondutor device set forth in claim 1, wherein said semiconductor device has at least three corners.

3. The semiconductor device set forth in claim 1, wherein said semiconductor device is rectangular and a bonding connection positioned at a corner of said semiconductor device is larger than the remaining bonding connections.

4. The semiconductor device of claim 1 wherein the contacts are attached to a semiconductor pellet.

5. The semiconductor device of claim 4 wherein said contacts and external leads are varied in size and area depending on their location on the semiconductor pellet.

6. The semiconductor device of claim 1 wherein the contacts are gold-covered, raised, metallic contacts.

7. The semiconductor device of claim 6 wherein the external leads are tin plated copper leads.

8. In a semiconductor device comprising a plurality of external leads to be bonded to a plurality of contacts by the application of a heat-bonding tool thereto which has a heating head covering an area corresponding to a plurality of pairs of external leads and contacts, said heating head exhibiting variations in local heat distribution when applied to said plurality of pairs to be heat-bonded thereto, the improvement which comprises providing said plurality of pairs having different contact areas between the external leads and the contacts, depending on the variations in local heat distribution of the heating head, all of the different contact areas being contacted by the heating head at one time, said pairs of external leads and contacts being with uniform bonding strength despite the variations in local heat distribution of the heating head, the difference between the contact areas functioning to compensate for said variations in the local heat distribution.

9. The semiconductor device of claim 1 or 8 wherein the contact area between the external leads and the contacts is increased where the heat distribution of the heat-bonding tool is lowest and wherein the contact area between the external leads and the contacts is reduced where the heat distribution of the heat-bonding tool is highest said variance in the contact area being achieved by increasing or decreasing the size of the contact or by increasing or decreasing the amount of the external leads in surface contact with the contact.

* * * * *